(12) United States Patent
Wang et al.

(10) Patent No.: US 6,984,559 B2
(45) Date of Patent: Jan. 10, 2006

(54) METHOD OF FABRICATING A FLASH MEMORY

(75) Inventors: Leo Wang, Hsinchu (TW); Chien-Chih Du, Hsinchu (TW); Saysamone Pittikoun, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 8 days.

(21) Appl. No.: 10/709,640

(22) Filed: May 19, 2004

(65) Prior Publication Data

US 2005/0176200 A1  Aug. 11, 2005

(30) Foreign Application Priority Data

Feb. 10, 2004  (TW) .............................. 93103004 A

(51) Int. Cl.
*H01L 21/336*  (2006.01)
(52) U.S. Cl. .................. 438/257; 438/258; 438/259; 257/315; 257/316
(58) Field of Classification Search .................... None
See application file for complete search history.

(56) References Cited

U.S. PATENT DOCUMENTS

| 6,844,231 | B2 * | 1/2005 | Kim et al. ................... 438/257 |
| 2002/0159886 | A1 * | 10/2002 | Hiyama et al. ............. 415/207 |
| 2004/0182815 | A1 * | 9/2004 | Lee et al. ...................... 216/13 |

* cited by examiner

*Primary Examiner*—Dung A. Le
(74) *Attorney, Agent, or Firm*—Jiang Chyun IP Office

(57) ABSTRACT

A method of fabricating a flash memory is provided. A substrate having several device isolation structures for defining an active region is provided. A tunneling dielectric layer and a patterned mask layer are formed over the active region. A portion of each device isolation structure is removed to form a plurality of trenches. A dielectric layer is formed over the substrate and a sacrificial layer is filled the trenches. A portion of the dielectric layer is removed using the sacrificial layer as a self-aligned mask. The patterned mask layer is removed and a conductive layer that exposed the top section of the sacrificial layers is formed over the substrate. After removing the sacrificial layer, an inter-gate dielectric layer and a control gate are formed over the substrate. A source region and a drain region are formed in the substrate on each side of the control gate.

20 Claims, 5 Drawing Sheets

METHOD OF FABRICATING A FLASH MEMORY

CROSS REFERENCE TO RELATED APPLICATIONS

This application claims the priority benefit of Taiwan application serial no. 93103004, filed Feb. 10, 2004.

BACKGROUND OF INVENTION

1. Field of the Invention

The present invention relates to a method of fabricating a memory device. More particularly, the present invention relates to a method of fabricating a flash memory and floating gate.

2. Description of Related Art

Flash memory is a type of electrically erasable programmable read-only memory (EEPROM). Flash memory is a memory device that allows multiple data writing, reading and erasing operations. The stored data will be retained even after power to the device is removed. With these advantages, it has been broadly applied in personal computer and electronic equipment. In addition, the flash memory is also a type of high-speed non-volatile memory (NVM) that occupies very little space and consumes very little power. Moreover, erasing is carried out in a block-by-block fashion so that the operating speed is higher than most conventional memory devices.

A typical flash memory device has a floating gate and a control gate formed by doped polysilicon. The control gate is set up directly above the floating gate with an inter-gate dielectric layer separating the two. Furthermore, a tunneling oxide layer is also set between the floating gate and the underlying substrate (the so-called stacked gate flash memory). To operate the flash memory, a positive or negative voltage is applied to the control gate so that electric charges can be injected into or released from the floating gate resulting in the storage or erasure of data.

FIGS. 1A through 1C are schematic cross-sectional views showing some of the steps for fabricating a conventional flash memory device. First, as shown in FIG. 1A, a substrate 100 having a plurality of device isolation structures 102 thereon for defining active regions 104 and a tunneling dielectric layer on the active regions 104 is provided. A conductive layer 108 is formed over the substrate 100 to cover the device isolation structures 102 and the tunneling dielectric layer 106. Thereafter, a planarization operation is carried out to remove a portion of the conductive layer 108 and smooth out the top surface of the conductive layer 108.

As shown in FIG. 1B, a patterned photoresist layer 109 is formed over the conductive layer 108. The patterned photoresist layer 109 exposes a portion of the conductive layer 108 on the device isolation structure 102. Thereafter, using the patterned photoresist layer 109 as a mask, a portion of the conductive layer 108 is removed to form a plurality of trenches 107 in the conductive layer 108 above the device isolation structures 102. The conductive layer 108 retained after forming the trenches 107 becomes the floating gate 110.

After removing the patterned photoresist layer 109, an inter-gate dielectric layer 112 is formed over the substrate 100 to cover the floating gate 110 as shown in FIG. 1C. Finally, a control gate 114 is formed over the inter-gate dielectric layer 112.

In the aforementioned fabrication process, the floating gate 110 is formed using photolithographic and etching processes. However, photolithographic and etching processes involve steps such as de-moisturize heating, coating, photoresist deposition, soft baking, photo-exposure, post photo-exposure baking, chemical development, hard baking and etching. Hence, the process not only is time consuming but also incurs additional production cost.

In addition, the aforementioned process utilizes a chemical-mechanical polishing (CMP) operation to planarize the conductive layer 108. Without a reference polishing stop layer, the thickness of conductive layer 108 retained after each chemical-mechanical polishing operation will be different. In other words, there is no control over to the thickness of the floating gate 110.

On the other hand, a larger gate-coupling ratio (GCR) between the floating gate and the control gate requires a lower operating voltage. The methods of increasing the gate-coupling ratio include increasing the capacitance of the inter-gate dielectric layer or reducing the capacitance of the tunneling oxide layer. One method of increasing the capacitance of the inter-gate dielectric layer is to enlarge the included area between the control gate and the floating gate. Thus, minimizing the size of the trenches 107 is able to increase the included area between the floating gate and the control gate and thus increase the gate-coupling ratio between them. However, when the conductive layer 108 is patterned, size of the trenches 107 is constrained by the photolithographic and etching processes. In other words, it is difficult to decrease the size of each trench 107 further. In the absence of any other method for increasing the included area between the control gate and the floating gate, improving the performance of the memory device is difficult.

SUMMARY OF INVENTION

Accordingly, the present invention is directed to a method of fabricating a flash memory capable of controlling the thickness of a floating gate inside the flash memory and increasing the gate-coupling ratio between the floating gate and a control gate for a higher device performance.

The present invention is also directed to a method of fabricating a floating gate such that there is no need to fabricate the mask for forming the floating gate. In other words, one photolithographic and etching process can be effectively avoided so that the fabricating process is more simplified.

According to an embodiment of the present invention, a method of fabricating a flash memory is provided. First, a substrate with a tunneling dielectric layer, a first conductive layer, a pad oxide layer and a patterned mask layer sequentially formed thereon is provided. Thereafter, using the patterned mask layer as a mask, a portion of the pad oxide layer, the first conductive layer, the tunneling dielectric layer and the substrate are removed to form a plurality of first trenches in the substrate. Insulating material is deposited into the first trenches to form a plurality of device isolation structures. A portion of each device isolation structure is removed to form a plurality of second trenches such that the top section of each retained device isolation structure lies between the tunneling dielectric layer and the patterned mask layer. A dielectric layer is formed over the substrate to cover the patterned mask layer and the surface of the second trenches. Material is deposited into various second trenches to form a sacrificial layer. The sacrificial layer and the dielectric layer are formed by different materials each having a different etching selectivity. Using the sacrificial layer as a self-aligned mask, a portion of the dielectric layer is removed. The patterned mask layer is removed to expose the pad oxide layer and then the pad oxide layer is removed to expose the first conductive layer. Thereafter, a second conductive layer is formed over the substrate. A portion of the second conductive layer is removed to expose the top section of the sacrificial layer. The second conductive layer and the first conductive layer together constitute a floating gate. The method of removing a portion of the second conductive layer to expose the top section of the sacrificial layer includes performing a chemical-mechanical polishing operation. Furthermore, the second conductive layer and the sacrificial layer are formed by different materials each having a different etching selectivity. Thereafter, the sacrificial layer is removed. An inter-gate dielectric layer is formed over the substrate to cover the floating gate. A control gate is formed over the inter-gate dielectric layer. Finally, a source region and a drain region are formed in the substrate on each side of the control gate.

In the process of forming the floating gate, the second trenches are formed over the device isolation structures before sequentially depositing the dielectric material and sacrificial material into the second trenches to form a stack structure. Thereafter, the stack structure is used to fabricate the floating gate. Hence, the present invention eliminates a mask for fabricating the floating gate. In other words, one photolithographic and etching process can be effectively avoided and hence the overall fabrication cost can be reduced.

Because the thickness of the floating gate correspond to the total height of the dielectric layer and the sacrificial layer, the thickness of the floating gate is determined by the total height of the dielectric layer and the sacrificial layer. Thus, the thickness of the floating gate can be precisely controlled.

In addition, the size of the second trenches can be reduced by forming a thicker dielectric layer. Hence, a floating gate with a larger size can be produced. With a larger floating gate, the included area between the control gate and the floating gate is increased so that a higher gate-coupling ratio is obtained.

The present invention also provides an alternative method of fabricating a flash memory. First, a substrate with a plurality of device isolation structures for defining active regions and a tunneling dielectric layer and a patterned mask layer sequentially formed over the substrate within the active regions is provided. Thereafter, a portion of each device isolation structure is removed to form a plurality of trenches. The top section of each retained device isolation structure lies between the tunneling dielectric layer and the patterned mask layer. A dielectric layer is formed over the substrate to cover the patterned mask layer and the surface of the trenches. Sacrificial material is deposited into the trenches to form a sacrificial layer. The sacrificial layer and the dielectric layer are formed by different materials each having a different etching selectivity. Using the sacrificial layer as a self-aligned mask, a portion of the dielectric layer is removed. Thereafter, the patterned mask layer is removed to expose the tunneling dielectric layer. A conductive layer is formed over the substrate. Afterwards, a portion of the conductive layer is removed to expose the top section of the sacrificial layer. The method of removing a portion of the conductive layer to expose the top section of the sacrificial layer includes performing a chemical-mechanical polishing operation. Furthermore, the conductive layer and the sacrificial layer are formed by different materials each having a different etching selectivity. Finally, the sacrificial layer is removed.

In the process of forming the floating gate, the trenches are formed over the device isolation structures before sequentially depositing the dielectric material and sacrificial material into the trenches to form a stack structure. Thereafter, the stack structure is used to fabricate the floating gate. Hence, the present invention eliminates the need to fabricate a mask for fabricating the floating gate. In other words, one photolithographic and etching process can be effectively avoided and hence the overall fabrication cost can be reduced.

Because the thickness of the floating gate correspond to the total height of the dielectric layer and the sacrificial layer, the thickness of the floating gate is determined by the total height of the dielectric layer and the sacrificial layer. Thus, the thickness of the floating gate can be precisely controlled.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
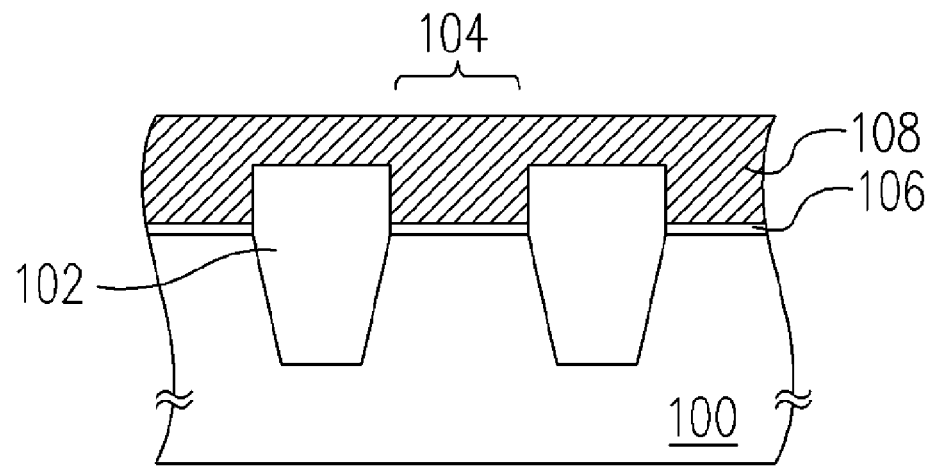
FIGS. 1A through 1C are schematic cross-sectional views showing some of the steps of fabricating a conventional flash memory device.
Figure 1B:
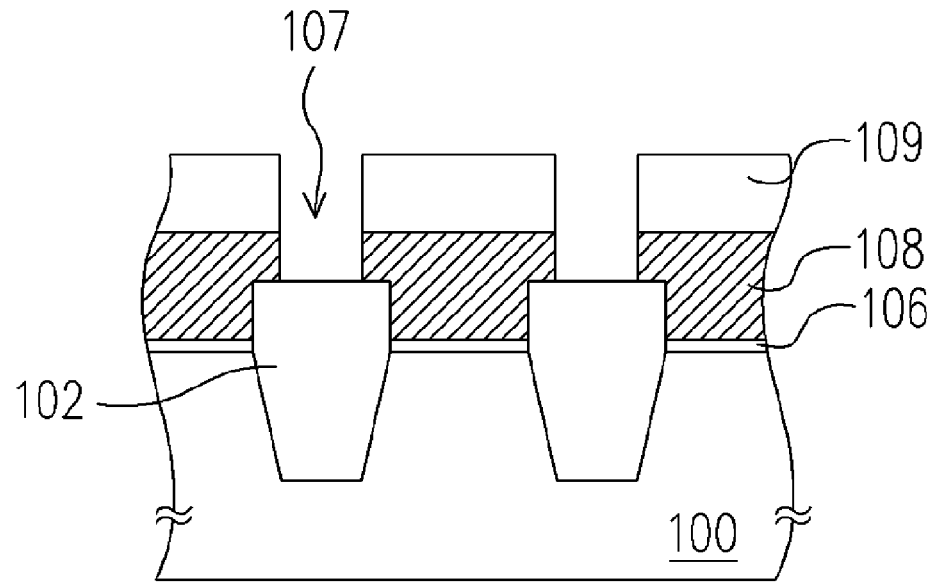
Figure 1C:
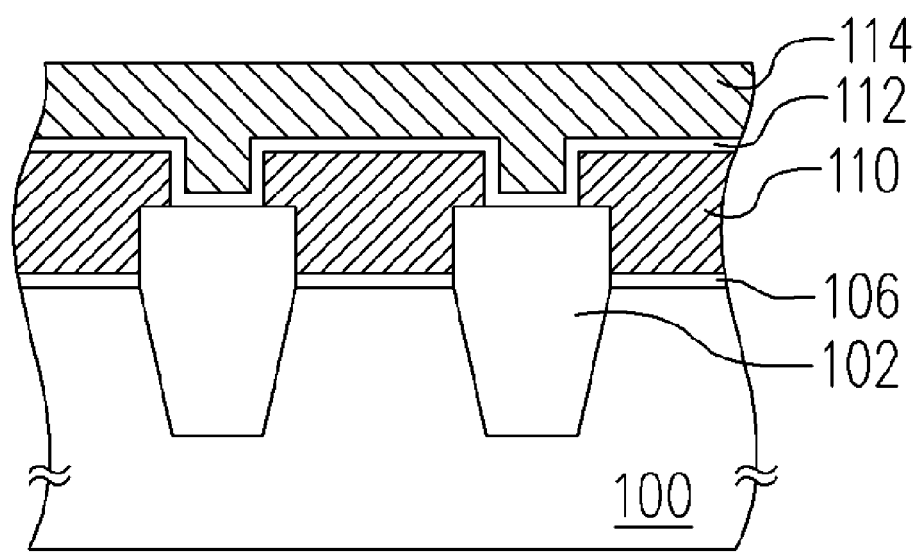

Reference will now be made in detail to the present preferred embodiments of the invention, examples of which are illustrated in the accompanying drawings. Wherever possible, the same reference numbers are used in the drawings and the description to refer to the same or like parts.

Figure 2A:
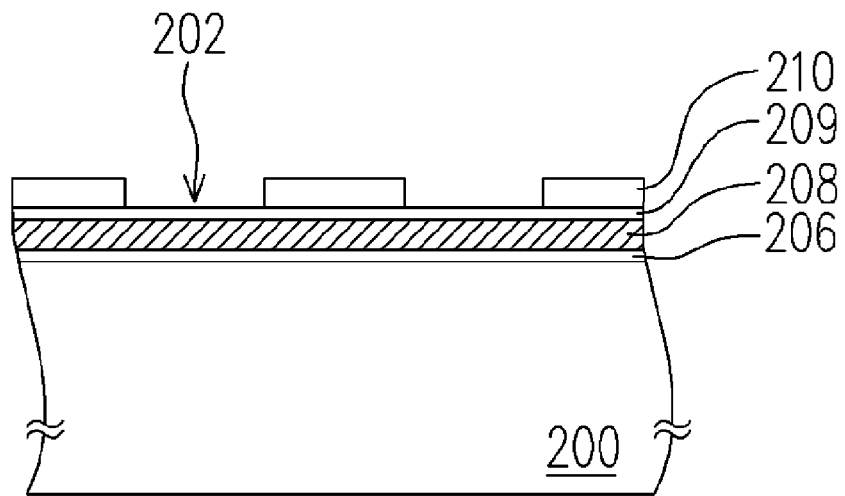
FIGS. 2A through 2F are schematic cross-sectional views showing the steps of fabricating a flash memory according to one embodiment of the present invention.

FIGS. 2A through 2F are schematic cross-sectional views showing the steps for fabricating a flash memory according to one embodiment of the present invention. As shown in FIG. 2A, a substrate 200 such as a silicon substrate is provided. Thereafter, a tunneling dielectric layer 206, a conductive layer 208, a pad oxide layer 209 and a patterned mask layer 210 are sequentially formed over the substrate 200. The patterned mask layer 210 has openings 202 that expose areas for forming a device isolation structure.

The tunneling dielectric layer 206 is silicon oxide layer having a thickness between about 70 Å to 90 Å formed, for example, by performing a thermal oxidation process. The conductive layer 208 is a doped polysilicon layer formed, for example, by performing a chemical vapor deposition process to form an undoped polysilicon layer (not shown) and then implanting ions into the undoped layer to form a doped polysilicon layer having a thickness between about 500 Å to 1000 Å. The pad oxide layer 209 is a silicon oxide layer having a thickness between about 15 Å to 50 Å formed, for example, by performing a thermal oxidation process. Furthermore, the patterned mask layer 210 is formed by a material having an etching selectivity that differs from the pad oxide layer 209, the conductive layer 208, the tunneling dielectric layer 206 and the substrate 200. The patterned mask layer 210 is a silicon nitride layer having a thickness between about 1500 Å to 2000 Å, for example. The patterned mask layer 210 is formed, for example, by performing photolithographic and etching processes.

Figure 2B:
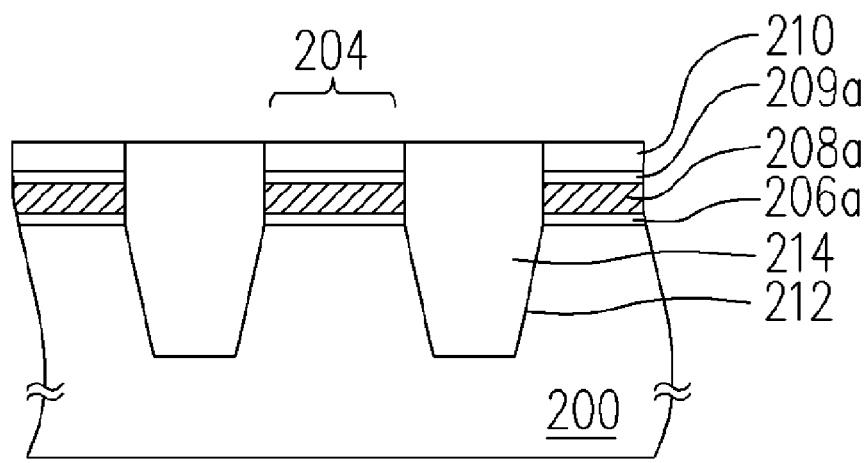

As shown in FIG. 2B, a portion of the pad oxide layer 209, the conductive layer 208, the tunneling dielectric layer 206 are removed using the patterned mask layer 210 as an etching mask to form a plurality of trenches 212. Ultimately, a tunneling dielectric layer 206a, a conductive layer 208a and a pad oxide layer 209a remain on top of the substrate 200. The trenches 212 have a depth of, for example, between about 3000 Å to 4000 Å.

Thereafter, an insulating material is deposited into the trenches 212 to form a plurality of device isolation structure 214 for defining an active region 204. The device isolation structure 214 is formed, for example, by performing a high-density plasma chemical vapor deposition (HDP-CVD) process to form a layer of insulation material (not shown) and then performing a chemical-mechanical polishing (CMP) operation to remove material outside the trenches.

It should be noted that, in this embodiment, the tunneling dielectric layer 206 is formed before forming the device isolation structures 214. This can prevent the formation of bird's beak in the neighborhood of the device isolation structure due to a subsequent thermal process if the device isolation structure 214 is formed first.

Figure 2C:
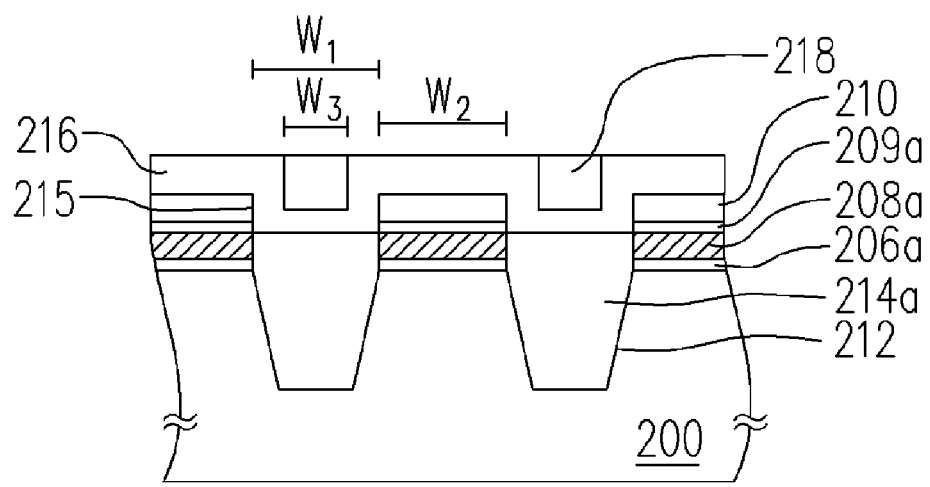

As shown in FIG. 2C, a portion of the insulation material in each device isolation structures 214 is removed to form a plurality of trenches 215. A top section of the remaining device isolation structure 214a lies between the tunneling dielectric layer 206a and the patterned mask layer 210. The method of removing a portion of the insulation material from the device isolation structures 214 to form the trenches 215 includes a dry etching process.

Thereafter, a dielectric layer 216 is formed over the substrate 200 to cover the patterned mask layer 210 and the surface of the trenches 215. The dielectric layer 216 is formed by a material having an etching selectivity that differs from the material for forming a conductive layer in a subsequent process. The dielectric layer 216 is a silicon nitride layer having a thickness between about 200 Å to 1000 Å formed, for example, by performing a chemical vapor deposition process. In this embodiment, both the dielectric layer 216 and the patterned mask layer 210 are formed by an identical material.

Sacrificial material is deposited into each trench 215 to form a sacrificial layer 218. The sacrificial layer 218 is formed by a material having an etching selectivity that differs from the material for forming a conductive layer in a subsequent process. The sacrificial layer 218 is a silicon oxide layer formed, for example, by depositing a layer of sacrificial material (not shown) and then performing a chemical-mechanical polishing operation or a back-etching process to remove sacrificial material lying outside the trenches 215. In another preferred embodiment, the sacrificial layers 218 are formed, for example, by spin-coating a layer of spin-on glass (SOG) over the substrate 200 to form a sacrificial layer (not shown) and then etching back the excess sacrificial material outside the trenches 215.

Figure 2D:
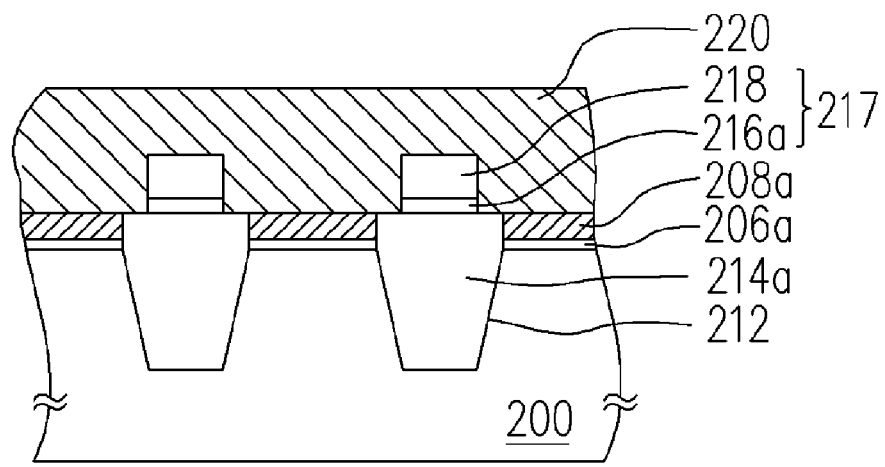

As shown in FIG. 2D, using the sacrificial layers 218 as a self-aligned mask, a portion of the dielectric layer 216 is removed. Since the sacrificial layers 218 and the dielectric layer 216 are fabricated from materials having a different etching selectivity, most of the dielectric layer 216 is removed except the dielectric layer 216a underneath the sacrificial layers 218. The dielectric layer 216a and the sacrificial layer 218 together form a sacrificial stacked layer 217. Because the dielectric layer 216 and the patterned mask layer 210 are formed by the same material (for example, silicon nitride) in this embodiment, the process of removing a portion of the dielectric layer 216 also removes the patterned mask layer 210.

Thereafter, the pad oxide layer 209a is removed to expose the conductive layer 208a. The pad oxide layer 209a is removed, for example, by wet etching using hydrofluoric acid solution as the etchant. A conductive layer 220 is formed over the substrate 200. With the conductive layer 208a already formed underneath, the conductive layer 220 is easier to form on top. In addition, the conductive layer 220 is formed by doped polysilicon, for example. The doped polysilicon layer is formed, for example, by performing a chemical vapor deposition process to form an undoped polysilicon layer (not shown) and then implanting ions into the undoped polysilicon layer.

Figure 2E:
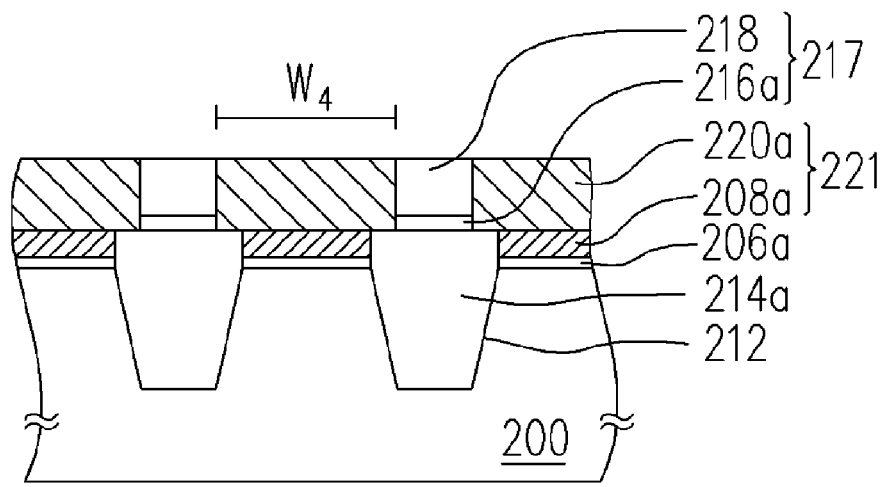

As shown in FIG. 2E, a portion of the conductive layer 220 is removed to expose the top section of the sacrificial layer 218 so that the retained conductive layer 220a and the conductive layer 208a together constitute a floating gate 221. The method of removing a portion of the conductive layer 220 to expose the top section of the sacrificial layer 218 includes performing a chemical-mechanical polishing operation using the sacrificial layer 218 as a polishing stop layer. Hence, the retained conductive layer 220a has a thickness related to the total height of the sacrificial stacked layer 217. In other words, a better control of the thickness of the floating gate 221 is obtained.

It should be noted that the thickness of the dielectric layer 216 on the sidewalls of the trenches 215 in FIG. 2C directly affects the size of the conductive layer 220a. That is, it also affects the overlapping area between the floating gate 221 and the control gate (not shown). Consequently, in the aforementioned step, a thicker dielectric layer 216 can be used to reduce the width of the trench 215 so that the distance between neighboring conductive layers 220a can be reduced. For example, in FIG. 2C, if the original width W1 of the trench 215 is 2000 Å and the width W2 of the patterned mask layer 210 between two trenches 215 is 1500 Å, the width W3 of the trench 215 would be 1000 Å after depositing a dielectric layer 216 with a thickness of about 500 Å. Hence, the conductive layer 220a originally having a maximum width of about 1500 Å (width W2 of the patterned mask layer 210) can have a wider width W4 of about 2500 Å as shown in FIG. 2E. In other words, electrical performance of the memory device can be increased by forming a thicker dielectric layer 216 to increase the overlapping area between the floating gate 221 and the control gate.

Figure 2F:
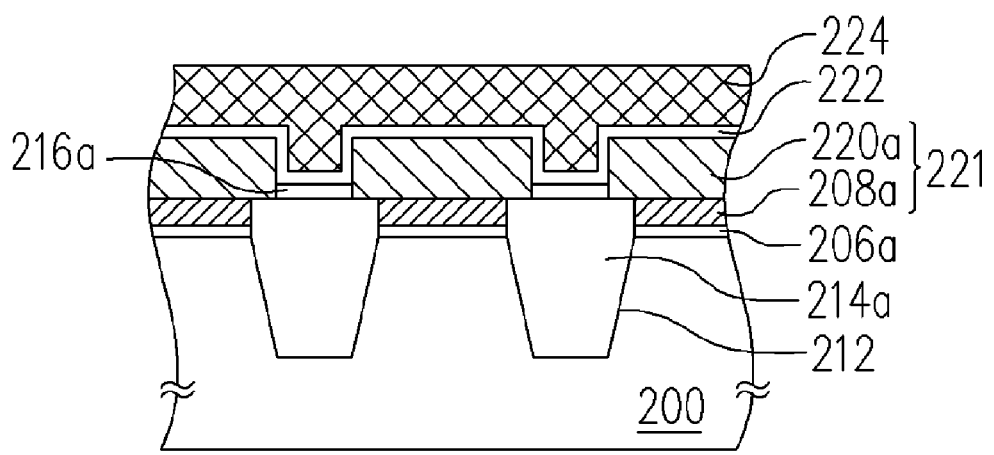

As shown in FIG. 2F, the sacrificial layers 218 are removed. The sacrificial layers 218 are removed, for example, by wet etching using hydrofluoric acid solution as the etchant. It should be noted that, in this embodiment, the trenches 215 are formed before the sacrificial stacked layer 217 that includes the dielectric layer 216 and the sacrificial layer 218 being formed. Then, the floating gate 221 is formed utilizing the sacrificial stacked layer 217 as the etching stop layer. Consequently, one photolithographic process is omitted and the production cost is reduced.

Thereafter, an inter-gate dielectric layer 222 is formed over the substrate 200 to cover the dielectric layer 216a and the floating gate 221. The inter-gate dielectric layer 222 is an oxide/nitride/oxide composite layer, for example. The inter-gate dielectric layer 222 is formed, for example, by performing a thermal oxidation process to form a silicon oxide layer over the substrate 200 and then performing a chemical vapor deposition process to form a silicon nitride layer and another silicon oxide layer over the first silicon oxide layer. The oxide/nitride/oxide composite layer has a first oxide layer with a thickness between 40 Å to 50 Å, a silicon nitride layer with a thickness between 45 Å to 70 Å and a second silicon oxide between 50 Å to 70 Å. Obviously, the inter-gate dielectric layer 222 can be an oxide/nitride composite layer too.

A control gate 224 is formed over the inter-gate dielectric layer 222. The control gate 224 is a doped polysilicon formed, for example by performing a chemical vapor deposition process to form a layer of undoped polysilicon (not shown) and implanting ions into the undoped polysilicon layer. Thereafter, a source region (not shown) and a drain region (not shown) are formed in the substrate on each side of the control gate 224. The source region and the drain region are formed, for example, by implanting impurities into the substrate 200 on each side of the control gate 224. Since subsequent fabrication processes should be familiar to those skilled in the techniques, detailed description is omitted here.

Aside from the aforementioned embodiment of the present invention, it should be noted that there is another embodiment. After removing the pad oxide layer 208a in FIG. 2D, the conductive layer 208a is removed before carrying out the step for forming the conductive layer 220 and the processes as shown in FIGS. 2E and 2F. Hence, the completed flash memory has a floating agate 221 including just the conductive layer 220a. Furthermore, in another preferred embodiment, a substrate 200 with only a tunneling dielectric layer 206 and a patterned mask layer 210 thereon is provided in FIG. 2A. Thus, the floating gate 221 of the flash memory also includes a single conductive layer 220a only. In yet another preferred embodiment, after removing the sacrificial layers 218 in FIG. 2F, further includes removing the dielectric layer 216a before carrying out the steps for forming the inter-gate dielectric layer 222 and the control gate 224.

In summary, major advantages of the present invention includes:

1. Trenches are formed over the device isolation structures before depositing dielectric material and sacrificial material into them to form a stack structure. Thereafter, the stack structure is used to fabricate the floating gate. Hence, the present invention eliminates the need to fabricate a mask for fabricating the floating gate. In other words, one photo-lithographic and etching process can be effectively avoided and hence the overall fabrication cost can be reduced.

2. Because the thickness of the floating gate correspond to the total height of the dielectric layer and the sacrificial layer, the thickness of the floating gate is determined by the total height of the dielectric layer and the sacrificial layer. Thus, the thickness of the floating gate can be precisely controlled.

3. With the size of the second trenches reduced by forming a thicker dielectric layer, a floating gate with a larger size can be produced. With a larger floating gate, the included area between the control gate and the floating gate is increased so that a higher gate-coupling ratio and hence a better electrical performance of the device is obtained.

4. The tunneling dielectric layer is formed before carrying out various steps for fabricating the device isolation structures. This can prevent the formation of bird's beak in the neighborhood of the device isolation structure due to a subsequent thermal process when the device isolation structure is formed first. Ultimately, the electrical performance of the memory device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory, comprising the steps of:

providing a substrate having a tunneling dielectric layer, a first conductive layer, a pad oxide layer and a patterned mask layer formed thereon;

removing portions of the pad oxide layer, the first conductive layer, the tunneling dielectric layer and the substrate using the patterned mask layer as an etching mask to form a plurality of first trenches in the substrate;

depositing an insulating material into the first trenches to form a plurality of device isolation structures;

removing a portion of each device isolation structure to form a plurality of second trenches such that the top section of each retained device isolation structure lies between the tunneling dielectric layer and the patterned mask layer;

forming a dielectric layer over the substrate to cover the patterned mask layer and the surface of the second trenches;

filling the second trenches with sacrificial material so as to form sacrificial layers;

removing a portion of the dielectric layer using the sacrificial layers as self-aligned masks;

removing the patterned mask layer to expose the pad oxide layer;

removing the pad oxide layer to expose the first conductive layer;

forming a second conductive layer over the substrate;

removing a portion of the second conductive layer to expose a top section of the sacrificial layers, wherein the second conductive layer and the first conductive layer together form a plurality of floating gates;

removing the sacrificial layer;

forming an inter-gate dielectric layer over the substrate to cover the floating gate;

forming a third conductive layer over the inter-gate dielectric layer to form a plurality of control gates; and forming a plurality of source/drain regions in the substrate on each side of the control gates.

2. The method of claim 1, wherein a material of the sacrificial layer and the dielectric layer have different etching selectivity and a material of the sacrificial layer and that of the second conductive layer have different etching selectivities.

3. The method of claim 2, wherein the material of the sacrificial layer comprises silicon oxide.

4. The method of claim 2, wherein the material of the dielectric layer comprises silicon nitride.

5. The method of claim 1, wherein the step for removing a portion of the second conductive layer to expose the top section of the sacrificial layer comprises performing a chemical-mechanical polishing operation.

6. The method of claim 1, wherein the dielectric layer and the patterned mask layer are formed by identical material so that the patterned mask layer is also removed in the process of removing a portion of the dielectric layer.

7. The method of claim 1, further comprising a step of removing the dielectric layer after the step of removing the sacrificial layer but before the step of forming the inter-gate dielectric layer.

8. The method of claim 1, wherein the step of forming the second trenches comprises etching back in a dry etching operation.

9. The method of claim 1, further comprising a step of totally removing the first conductive layer after the step of removing the pad oxide layer but before the step of forming the second conductive layer.

10. A method of fabricating a floating gate, comprising the steps of:
   providing a substrate having a plurality of device isolation structures for defining an active region and a tunneling oxide layer and a patterned mask layer sequentially formed within the active region over the substrate;
   removing a portion of each device isolation structure to form a plurality of trenches, wherein the top section of each retained device isolation structure is disposed between the tunneling dielectric layer and the patterned mask layer;
   forming a dielectric layer over the substrate to cover the patterned mask layer and the surface of the trenches;
   filling the trenches with sacrificial material so as to form sacrificial layers;
   removing a portion of the dielectric layer using the sacrificial layers as a self-aligned mask;
   removing the patterned mask layer to expose the tunneling dielectric layer;
   forming a first conductive layer over the substrate;
   removing a portion of the first conductive layer to expose the top section of the sacrificial layers; and
   removing the sacrificial layers.

11. The method of claim 10, wherein a material of the sacrificial layer and the dielectric layer have different etching selectivities and a material of the sacrificial layer and the first conductive layer have different etching selectivities.

12. The method of claim 11, wherein the material of the sacrificial layer comprises silicon oxide.

13. The method of claim 11, wherein the material of the dielectric layer comprises silicon nitride.

14. The method of claim 10, wherein the step for removing a portion of the first conductive layer to expose the top section of the sacrificial layer comprises performing a chemical-mechanical polishing operation.

15. The method of claim 10, wherein the dielectric layer and the patterned mask layer are formed by identical material so that the patterned mask layer is also removed in the process of removing a portion of the dielectric layer.

16. The method of claim 15, wherein a material of the dielectric layer and the patterned mask layer comprises silicon nitride.

17. The method of claim 10, wherein the step of forming the trenches comprises etching back in a dry etching operation.

18. The method of claim 10, further comprising a step of removing the dielectric layer after the step of removing the sacrificial layers.

19. The method of claim 10, wherein a second conductive layer and a pad oxide layer are formed between the tunneling oxide layer and the patterned mask layer, and the method further comprises a step of removing the pad oxide layer after the step of removing the mask layer.

20. The method of claim 19, further comprising a step of removing the second conductive layer after the step of removing the pad oxide layer.

* * * * *